US006332151B1

United States Patent
Van Den Enden et al.

(10) Patent No.: US 6,332,151 B1
(45) Date of Patent: Dec. 18, 2001

(54) TIME DISCRETE FILTER

(75) Inventors: Adrianus W. M. Van Den Enden, Eindhoven; Rutgerus E. E. F. Suermondt, Tau, both of (NL)

(73) Assignee: U.S. Philips Corporation, New York, NY (US)

(*) Notice: Subject to any disclaimer, the term of this patent is extended or adjusted under 35 U.S.C. 154(b) by 0 days.

(21) Appl. No.: 09/233,842

(22) Filed: Jan. 20, 1999

(30) Foreign Application Priority Data

Jan. 26, 1998 (EP) .................................................. 98200218

(51) Int. Cl.$^7$ ...................................................... G06F 17/10
(52) U.S. Cl. ............................................. 708/313; 708/312
(58) Field of Search ..................................... 708/313, 312

(56) References Cited

U.S. PATENT DOCUMENTS

| 4,896,320 | * | 1/1990 | Gockler | 708/313 |
| 5,432,511 | * | 7/1995 | Sadjadian et al. | 708/313 |
| 5,689,449 | * | 11/1997 | Saramaki et al. | 708/313 |
| 5,757,867 | * | 5/1998 | Caulfield et al. | 708/313 |
| 6,173,302 | * | 1/2001 | Piirainen | 708/313 |

OTHER PUBLICATIONS

By M. Ikehara and S. Takahashi in Electronics and Communications in Japan, "Design of Multirate Bandpass Digital Filters with Complex Coefficients", Part 1, vol. 71, No. 1, 1988, pp. 21–29, which is Translated from Denshi Tsushin Gakkai Robunshi, vol. 69–A, No. 8, Aug. 1986, pp. 950–957.

* cited by examiner

Primary Examiner—David H. Malzahn
(74) Attorney, Agent, or Firm—Jack D. Slobod

(57) ABSTRACT

A decimating time discrete filter comprises transform means (2) for transfornming a real valued input signal i into a complex signal u represented by its real part Re{U} and its imaginary part Im{u}. The output signal u is down sampled by means of a decimator (4) which reduces the sample frequency by a factor of 2. Due to the downsampling process, a desired tone input signal can be translated to a different frequency. In order to prevent interference from signals at the input having the same frequency as the desired input signal, the transform means (2) have a transfer function with an increased width transition band from the frequency of the desired input signal to the frequency to which said input frequency is converted.

12 Claims, 10 Drawing Sheets

| FIG.5(1) | FIG.5(2) | FIG.5(3) |

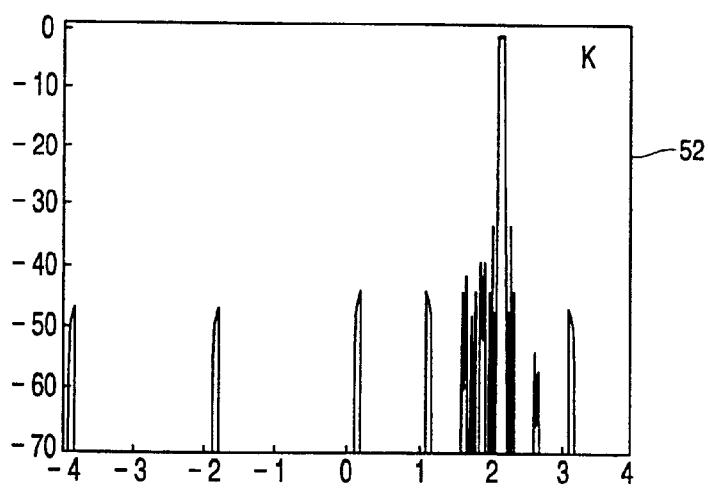
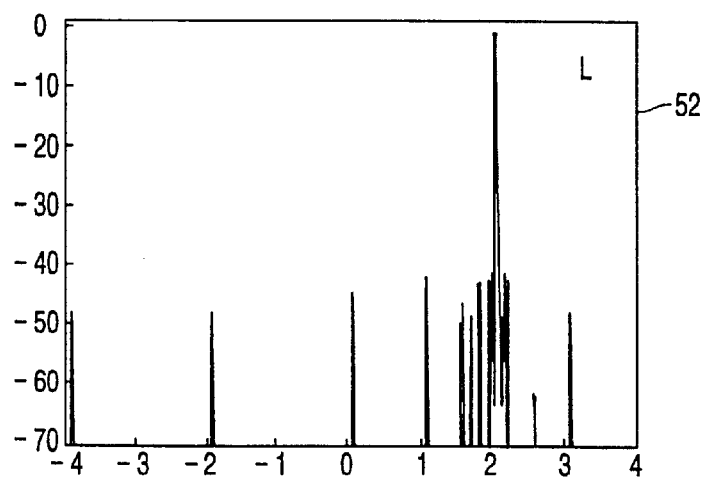
FIG. 5(3)
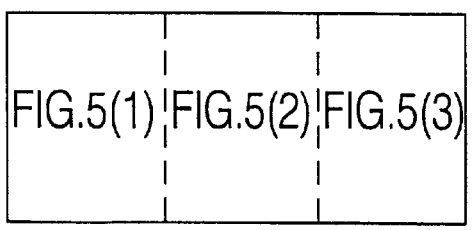

TIME DISCRETE FILTER

The present invention relates to a time discrete filter comprising a cascade connection of a plurality of decimating filter sections. The invention also relates to a tone detector using a filter according to the invention.

A filter according to the preamble is known from the article "Design of Multirate Bandpass Digital Filters with Complex Coefficients" by M. Ikehara and S. Takahashi in Electronics and Communications in Japan, Part 1, Vol. 71, No. 1, 1988, pp. 21–29, which is translated from Denshi Tsushin Gakkai Robunshi, Vol. 69-A, No. Aug. 8, 1986, pp. 950–957

Such filters can be used for selecting signals having a relative small bandwidth from an input signal having a larger bandwidth. This is e.g. the case in tone detectors which are used for detecting the presence of one or more tones in an input signal. Tone detectors are used in telephone systems for detecting signaling tones such as CAS tones, DTMF tones and dial tones.

CAS tones are used in the ADSI (Advanced Digital Signaling Interface) standard for signaling to an ADSI (screen) telephone terminal that the exchange will transmit digital information to said digital telephone terminal.

DTMF tones are used for sending dial information from a telephone terminal to an exchange. They can also be used for transmitting information such as caller-ID to a telephone terminal.

All these applications have in common that a signal having a small bandwidth has to be selected from an input signal having a much larger bandwidth. The selection of such a small bandwidth signal can be realized by sampling the input signal with an adequate sampling frequency, and by filtering the sampled signal with a band pass filter with a small bandwidth centered around the nominal frequency of the signal to be selected.

If such a filter is designed for using the same sample frequency from the input to the output, such a filter requires a substantial amount of computational resources (chip-area, power consumption or processor cycles). By using a cascade connection of a plurality of decimating filter sections the required amount of computational resources can be reduced, because the first decimating filter section runs on the sample frequency of the input signal. The other filter sections run on sampling frequencies decreasing after every decimation step.

In the filter according to the above mentioned article complex coefficients are allowed in order to reduce the required amount of computational resources. Furthermore the known filter comprises transformation means for transforming a real input signal into a complex output signal which is represented by real and imaginary signal components.

The transformation means known from the above article derive their output signals from the input signal by means of a Hilbert transformer. Such a Hilbert transformer suppresses all negative frequency components, and passes all positive frequency components. A Hilbert transformer requires a substantial amount of computational resources, which results in an expensive implementation of the filter.

An object of the present invention is to provide a digital filter according to the preamble which requires less computational resources.

For achieving said object the digital filter is characterized in that the transformations means have a transfer function with a transition band between a frequency in the pass band and a frequency to which a pass-band signal is transferred at the output of said transform means.

The present invention is based on the recognition that it is not necessary to suppress all negative frequencies as in done by the Hilbert transformer according to the prior art, but that it is sufficient to suppress only the frequencies in the input signal of the transformation means to which the signals to be passed are transferred by the decimation means. The above recognition leads in general to transformation means having a larger transition band. This results in a substantial decrease of the required amount of computational resources.

It is observed that the filter according to the invention can be a digital filter, but it is also possible that the filter according to the invention is implemented as a switched capacitor or as a switched current filter.

An embodiment of the present invention is characterized in that said at least one filter section has a transfer function being obtained by a transformation of a transfer function symmetrical around zero.

By using a filter with a transfer function which is obtained by a transformation of a transfer function symmetrical around zero, this filter can be based on a prototype filter which can easily be designed by using standard design tools.

A further embodiment of the invention is characterized in that the transformation is defined by shifting the transfer function according to a frequency shift. A frequency shift is a very easy transformation which can be performed easily.

A further embodiment of the invention is characterized in that the frequency shift is a multiple of one eighth of the sample frequency of the input signal of the decimating filter section.

If the frequency shift is a multiple of one eighth of the sample frequency, the filter section can have the same coefficients as the prototype filter it is derived from. If also such prototype filter is used in other filter sections the coefficients need to be stored only once.

A still further embodiment of the invention is characterized in that the frequency shift is a multiple of one fourth of the sample frequency of the decimating filter section.

If the frequency shift is a multiple of one fourth of the sample frequency of the input signal of the filter section, no additional multipliers are required in the filter, because a multiplication with j or −j can be obtained by taking a signal from a suitable branch in the filter.

A further embodiment of the invention is characterized in that the filter sections are arranged for decimating the input signal with a factor n, and in that the filter elements have delay elements with a delay value equal to n times the sampling period of the signal at the output of the preceding stage.

If the filter sections comprise delay elements with a delay value equal to the decimation factor and the sample period of the input signal, the filter section can be simplified by placing the decimator, which is normally placed behind the filtering element in the filter section, before the filtering element. Consequently, the clock frequency of the filter element can be reduced by a factor N.

A further embodiment of the invention is characterized in that the filter elements are of the bireciprocal type.

A bireciprocal filter is a filter with a transfer function which can be written as:

$$F(z) = C \cdot \{G_1(z^2) + z^{-1} \cdot G_2(z^2)\} \tag{1}$$

In (1) $G_1$ and $G_2$ are equal to:

$$G_1(z^2) = \prod_{j=1}^{K} \frac{B_j + z^{-2}}{1 + B_j \cdot z^{-2}} \quad \text{and} \quad G_2(z^2) = \prod_{j=1}^{L} \frac{C_j + z^{-2}}{1 + C_j \cdot z^{-2}} \quad (2)$$

In (2) K is equal to L or equal to L+1. It is observed that $G_i$ reduces to 1 if $B_j$ or $C_j$ is equal to 1.

Due to the term $z^{-2}$ in $G_i(z^2)$ it is possible to place a downsampling means for reducing the sample rate with a factor of 2 in the filter section directly before the filter elements which realize the transfer fimctions according to (2) It can further be seen that for a third order filter (K=1, L=0) only one coefficient $B_1$ has to be stored. For a fifth order filter section (K=1, L=1) only two coefficients $B_1$ and $C_1$ have to be stored.

The present invention will now be explained with reference to the drawings.

Figure 1:
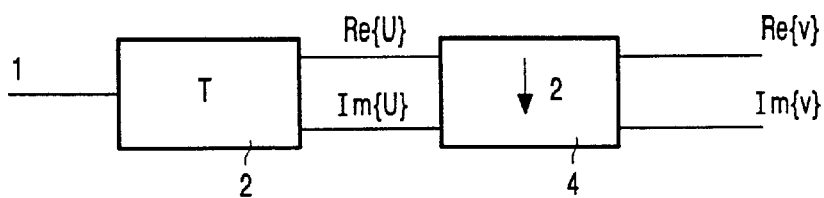
FIG. 1 shows a first embodiment of a digital filter according to the present invention.

In the digital filter according to FIG. 1, a real valued input signal i is applied to transformation means 2 which transforms the real valued signal i into a complex signal u, which is represented by the real part $\Re e\{u\}$ and the imaginary part $\Im m\{u\}$. The signals $\Re e\{u\}$ and $\Im m\{u\}$ are downsampled by a factor 2 by a decimator 4. At the output of the decimator 4 a complex output signal v, represented by a real part $\Re e\{v\}$ and an imaginary part $\Im m\{v\}$, is available. The implementation of the transform means 2 can be done according to FIG. 6 or FIG. 7 as will be discussed later.

Figure 2:
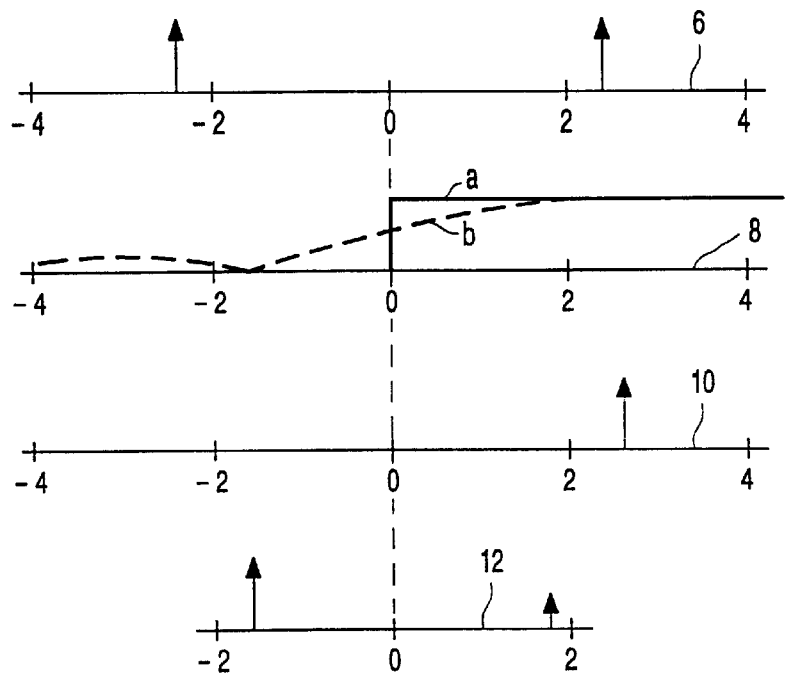
FIG. 2 shows frequency spectra of signals and transfer functions of elements in the digital filter according to FIG. 1

Graph 6 in FIG. 2 shows the frequency spectrum of a tone of 2130 Hz which is sampled with a sample frequency of 8 kHz. Due to the periodicity of the spectrum the parts below −4 kHz and above +4 kHz need not be shown.

Graph 8 in FIG. 2 shows the transfer function of the transform means 2. Curve a shows the transfer function of a Hilbert transformer as used in the prior art digital filter. Curve b shows the transfer function of transform means according to the invention. From curve b, it can be seen that the transition band of the transform means according to the invention is substantially less steep than the transition band of the transfer function of the Hilbert transformer used in the prior art device. According to the inventive concept of the present invention, the transform means need only suppress the frequencies to which the desired input sinnap is converted to by the decimator 4. In the case of an input signal component with a frequency of +2130 Hz, only a frequency of −1870 Hz has to be suppressed.

Graph 10 shows the spectrum of the output signal of the transform means 2. It can be seen that the negative spectral component of the input signal is strongly attenuated, however this is not necessary for the filter according to the invention, as long as signal components with a frequency of −1870 Hz remain suppressed.

Graph 12 shows the frequency spectrum of the output signal of the decimator 4. Due to the decimation process, the signal component with a frequency of+2130 Hz is converted to a frequency of −1870 Hz. Due to the suppression of frequencies of −1870 Hz (the frequencies to which the pass-band signals are transferred) by the transform means 2, spurious signal components with a frequency of −1870 Hz at the input of the transform means 2 will not be visible at the output of the decimator 4. Consequently the signal component with a frequency of −1870 Hz which is obtained by conversion of the +2130 Hz signal, is not subjected to interference due to −1870 Hz signal components at the input of the transform means 2.

Figure 3:
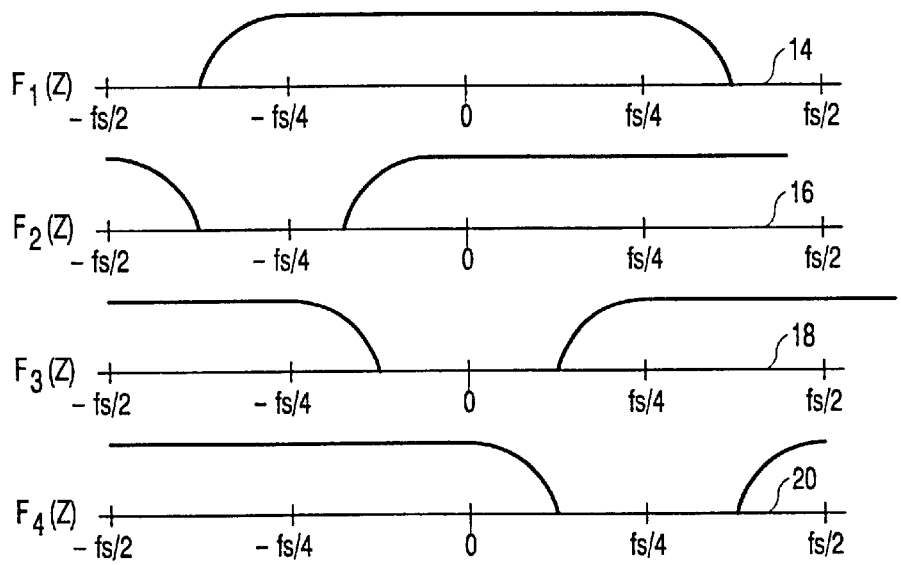
FIG. 3 shows the transfer functions of a plurality of filters which can be obtained by a simple transform from a prototype filter.

FIG. 3 shows the transfer function of several filter sections as function of their input sample frequencies. Also the z operator introduced with respect to the transfer function of these filters is related to the actual input sample frequency of the filter section. Graph 14 of FIG. 3 shows the transfer function of a prototype low pass filter $F_1(z)$ with a pass band from −0.25$f_s$ to +0.25$f_s$ and a stopband from −0.5$f_s$/2 to −0.4$f_s$ and from 0.4$f_s$ to 0.5$f_s$. The transfer function $F_1(z)$ of the prototype filter is equal to:

$$F_1(z) = \frac{1}{2}\left(\frac{B + z^{-2}}{1 + B \cdot z^{-2}} + z^{-1}\right) \quad (3)$$

In (3) B is equal to 0.37186879668. This transfer function provides a stop band rejection of 40 dB. For implementation purposes B can be rounded to ⅜ resulting in a decrease of only 1 dB of the stop band rejection.

Graph 16 of FIG. 3 displays the transfer function $F_2(z)$ of a filter which is obtained by transforming the transfer function $F_1(z)$ by shifting it by $f_s/4$ over the frequency axis. In general a shift over the frequency axis can be obtained by the following transformation of z:

$$z' = z \cdot e^{j 2\pi \frac{\Delta f}{f_s}} = z \cdot e^{j\varphi} \quad (4)$$

In (4) $\Delta f$ is the value of the frequency shift to the left. According to (4), the transfer function $F_2(z)$ can be realized by substituting z by −jz. Consequently for the transfer function $F_2(z)$ is found:

$$F_2(z) = \frac{1}{2}\left(\frac{B-z^{-2}}{1-B\cdot z^{-2}} + j\cdot z^{-1}\right) \quad (5)$$

The transfer function $F_3(z)$, as is shown in graph 18 in FIG. 3, is obtained by shifting $F_1(z)$ over $\Delta f=f=f_2$. According to (4) this transformation can be realized by replacing z by −z. For $F_3(z)$ is found in this way:

$$F_3(z) = \frac{1}{2}\left(\frac{B+z^{-2}}{1+B\cdot z^{-2}} - z^{-1}\right) \quad (6)$$

The transfer function $F_4(z)$ according to graph 20 in FIG. 3 is obtained by shifting $F_1(z)$ over $\Delta f=f_s/4$ to the right. This transformation can be represented by replacing z by jz. For the transfer function $F_4(z)$ is found:

$$F_4(z) = \frac{1}{2}\left(\frac{B-z^{-2}}{1-B\cdot z^{-2}} - j\cdot z^{-1}\right) \quad (7)$$

Figure 4:
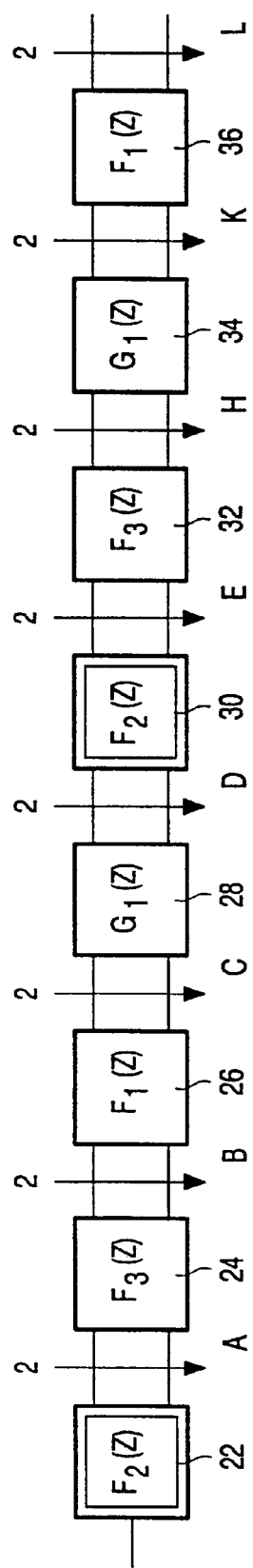
FIG. 4 shows a second embodiment of a digital filter according to the invention which is used for selecting a single frequency tone.

In the digital filter according to FIG. 4, it is assumed that the desired input signal is a tone of 2130 Hz which is sampled with a sample frequency of 8 kHz. In each filter section, the sample frequency is reduced by a factor 2 as will be explained later. For clarity reasons it is indicated in FIG. 4 between the filter sections that a sample frequency reduction takes place.

In the transform means 22 the real valued input signal is converted into a complex signal which is represented by real and imaginary parts available at interface A. At the output of the first filter section the sample frequency is 4 kHz. Due to this decrease in sample frequency the tone at +2130 Hz at the input of the filter is converted to a tone at −1870 Hz. It is observed that in the design of the transform means 22 it was decided to select the tone at +2130 Hz. The transfer function of the transform means 22 has to be chosen to pass the tone at +2130 Hz $(0,27f_s)$ substantially unattenuated, and to suppress signal components at a frequency of −1870 Hz. $(-0.23f_s)$. Consequently the transform means 22 has a transition band between $(-0.23f_s)$ and $(027f_s)$. Looking at the four different transfer functions in FIG. 3, it can easily be seen that the above requirements can only be met by the transfer function $F_2(z)$.

The signal at the input A of the filter section 24 carries a signal with a desired signal component with a frequency of −1870 Hz. Said signal has a sample frequency of 4 kHz. After downsampling to a sample frequency of 2 kHz at the output of the filter section 24, the desired signal component is transferred to a frequency of +130 Hz. Consequently the filter section 24 has to pass signals with a frequency of −1870 Hz $(-0.47f_s)$ and has to suppress signals with a frequency of +130 Hz $(0.03f_s)$. This requirement can be met by the transfer function $F_3(z)$ and the corresponding downsampler. This transfer function $F_3(z)$ is displayed in FIG. 3.

The signal at the input B of the filter section 26 carries a signal with a desired signal component of +130 Hz. Said signal has a sample frequency of 2 kHz. After downsampling from 2 kHz to 1 kHz at the output of filter section 26 the desired signal component remains at +130 Hz. Consequently the filter section 26 has to pass the signal component at +130 Hz. $(0.07f_s)$. The transfer function $F_1(z)$ in FIG. 3 meets this requirement.

The signal at the input C of the filter section 28 carries a signal with a desired signal component of +130 Hz. Said signal has a sample frequency of 1 kHz. After downsampling from 1 kHz to 500 Hz at the output of filter section 28, the desired signal component remains at +130 Hz. Consequently the filter section 28 has to pass the signal component at +130 Hz. $(0.13f_s)$. The transfer function $F_1(z)$ in FIG. 3 would meet this requirement, but simulations showed a too low stop band rejection. In order to solve this, for the filter section 28 a fifth order transfer function $G_1(z)$ instead of the third order transfer function $F_1(z)$ is used. For the fifth order transfer function $G_1(z)$ can be written:

$$G_1(z) = \frac{1}{2}\left(\frac{C+z^{-2}}{1+C\cdot z^{-2}} + z^{-1}\frac{D+z^{-2}}{1+D\cdot z^{-2}}\right) \quad (8)$$

In (8) C has a value of 0.208288244066 and D has a value of 0.682073157635. For implementation purposes C can be rounded to $7/32$ and D can be rounded to $22/32$. This rounding results in a loss of stop band attenuation of 3 dB If C and D are rounded to $13/64$ and $43/64$ respectively, the loss of stop band attenuation can be neglected.

The signal at the input D of the filter section 30 carries a signal with a desired signal component of +130 Hz. Said signal has a sample frequency of 500 Hz. After downsampling from 500 Hz to 250 Hz at the output of filter section 30, the desired signal component is transferred to −120 Hz. Consequently the filter section 30 has to pass the signal component at +130 Hz. $(0.26f_s)$ and has to suppress signal components at −120 Hz $(-0.24f_s)$. From FIG. 3 it can be seen that transfer function $F_2(z)$ fulfills this requirements.

The signal at the input E of the filter section 32 carries a signal with a desired signal component of −120 Hz. Said signal has a sample frequency of 250 Hz. After downsampling from 250 Hz to 125 Hz at the output of filter section 32, the desired signal component is transferred to +5 Hz. Consequently the filter section 32 has to pass the signal component at −120 Hz. $(0.48f_s)$ and has to suppress signal components at +5 Hz $(-0.02f_s)$. From FIG. 3 it can be seen that transfer function $F_3(z)$ fulfills this requirements.

The signal at the input H of the filter section 34 carries a signal with a desired signal component of +5 Hz. Said signal has a sample frequency of 125 Hz. After downsampling from 125 Hz to 62.5 Hz at the output of filter section 34, the desired signal component remains at +5 Hz. Consequently the filter section 34 has to pass the signal component at +5 Hz. $(0.04f_s)$ and has to suppress other signal components. From FIG. 3 it can be seen that transfer function $F_1(z)$ fulfills this requirements, but the transfer function $G_1(z)$ is used for obtaining improved stop band rejection.

The signal at the input K of the filter section 36 carries a signal with a desired signal component of +5 Hz. Said signal has a sample frequency of 62.5 Hz. After downsampling from 67.5 Hz to 31.25 Hz at the output of filter section 36, the desired signal component remains at +5 Hz. Consequently the filter section 364 has to pass the signal component at +5 Hz. $(0.08f_s)$ and has to suppress other signal components. From FIG. 3 it can be seen that transfer function $F_1(z)$ fulfills this requirements.

After this filtering and downsampling a filter with an effective bandwidth of approximately 32 Hz is obtained. The computational effort is quite low due to the low order of the filter sections (third or fifth) and the decreasing sample rate in the filter. The output signal of the complete filter is available at output L.

For use in a tone detector, the presence of a desired signal can be done by adding the squares real and imaginary parts at the output L and comparing the summed squared value with a threshold value.

Figure 5:
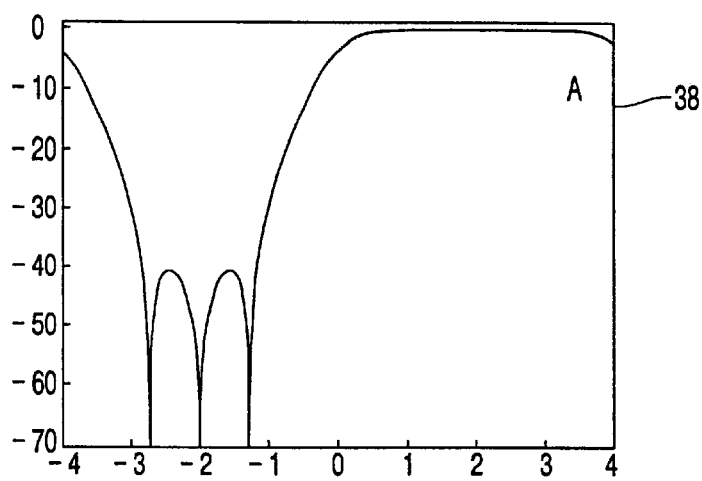
FIG. 5 shows transfer functions of the sections of the filter according to FIG. 4.
Figure 5:
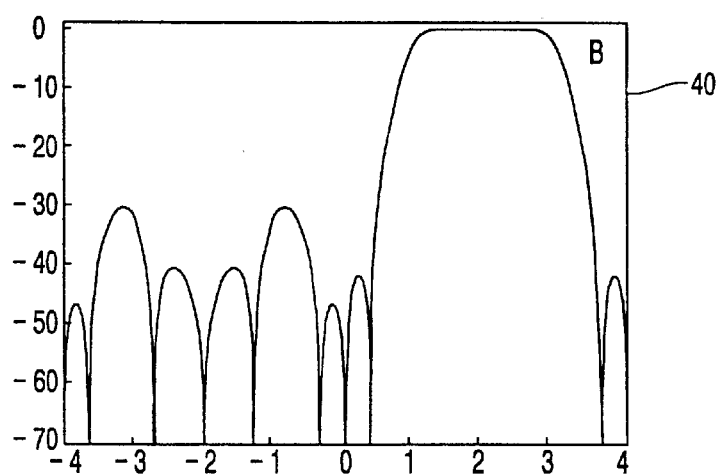
Figure 5:
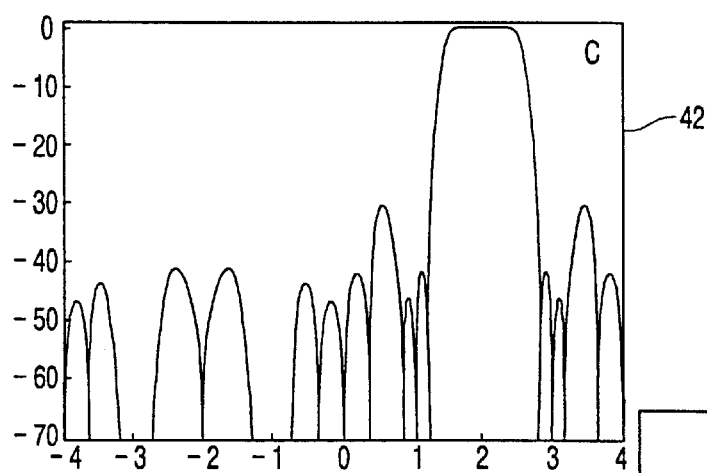
Figure 5:
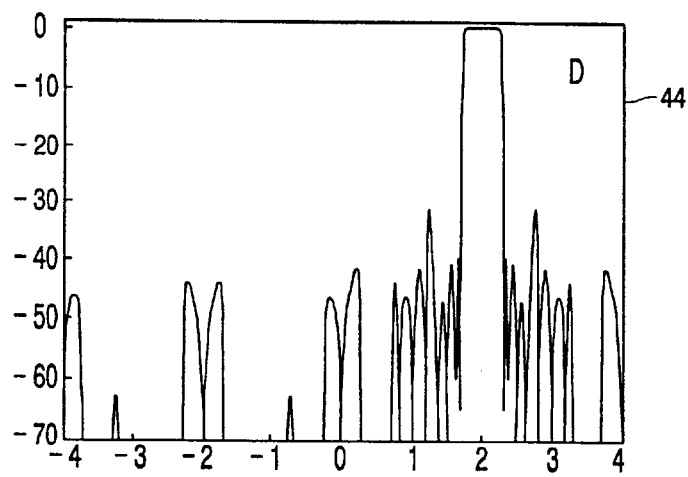
Figure 5:
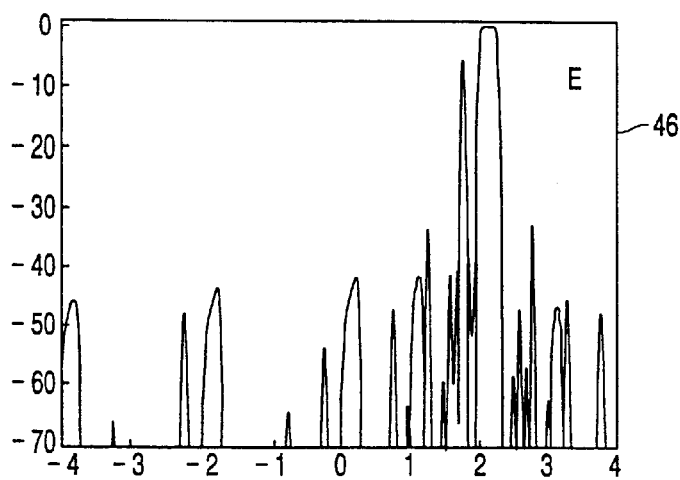
Figure 5:
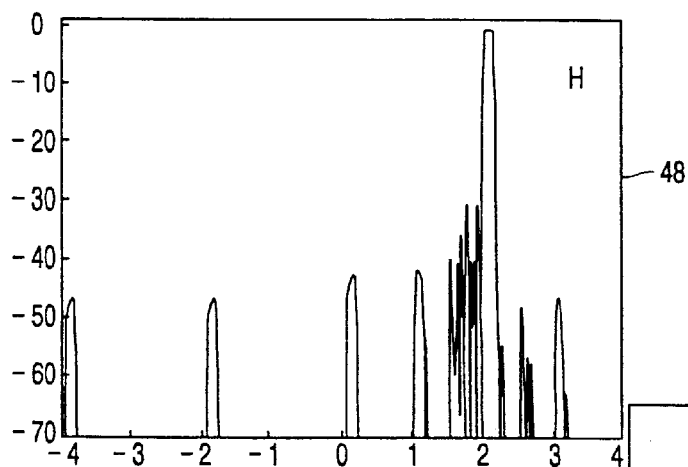

The graphs according to FIG. 5 show the ratio between the amplitude of the signal at the input of the filter according to FIG. 4 and the amplitude of the output signals of the several filter sections as function of the frequency of the input signal. It is observed that a frequency component of the input signal in general is transformed to a different output frequency, making that the graphs according to FIG. 4 do not display a commonly known transfer function.

Graph 38 shows the transfer function of the transform means 22. Graph 40 shows the transfer function of the combination of the transform means 22 and the filter section 24. Graph 42 shows the transfer function of the combination of the transform means 22 and the filter sections 24 and 26. Graph 44 shows the transfer function of the combination of the transform means 22 and the filter sections and 28. Graph 46 shows the transfer function of the combination of the transform means 22 and the filter sections 24, 26, 28 and 30. Graph 48 shows the transfer function of the combination of the transform means 22 and the filter sections 24, 26, 28, 30 and 32. Graph 50 shows the transfer function of the combination of the transform means 22 and the filter sections 24, 26, 28, 30, 32 and 34. Graph 52 shows the transfer function of the combination of the transform means 22 and the filter sections 24, 26, 28, 30, 32, 34 and 36.

From the graphs in FIG. 5 can be seen that the bandwidth of the pass band of the filter according to FIG. 4 is reduced by a factor of 2 in every filter section. Furthermore the stop band rejection is improved in every step.

It is observed that in the current implementation of the filter according to FIG. 4 bireciprocal filters are used, but it is also possible to implement the filter with other filter types. E.g. transversal filters and IIR filters differing from bireciprocal filters are also suitable for realizing the filter according to FIG. 4, although this could result in a higher implementation complexity.

Figure 6:
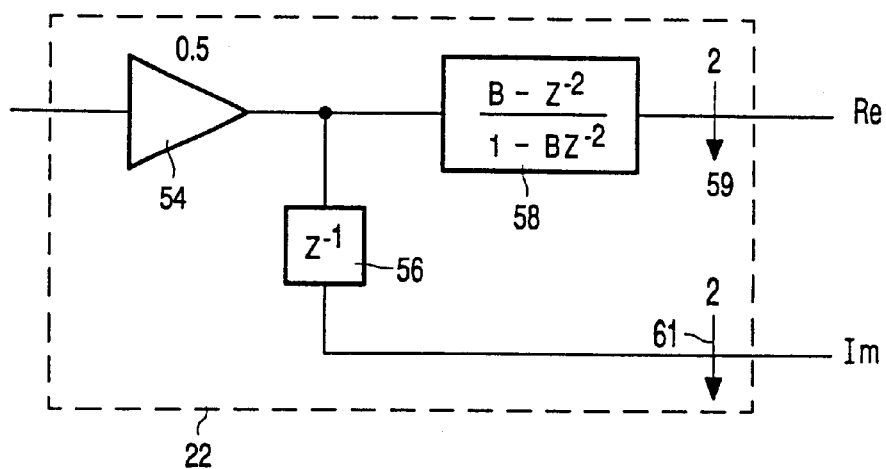
FIG. 6 shows a first embodiment of the filter section 22 in the digital filter according to FIG. 5.

In the implementation of the transform means 22 according to FIG. 6, the input is connected to a scaling element 54 which scales the input signal by a factor 0.5. This scaling element 54 is present to obtain a unity gain of the transform means in the pass band. The scaling elements used to obtain a unity gain can be dispensed with if a non-unity gain is taken into account in designing the system the filter is used in. The output of the scaling element 54 is connected to an input of a filter element 58 and to an input of a delay element 56. The output of the filter element 58 is connected to a decimator 59 which reduces the sampling rate by a factor of 2 by deleting one out of every two samples. The output of the delay element 56 is connected to a decimator 61 which reduces the sample rate by a factor of 2.

For the transfer function of the transform means 22 according to FIG. 6 can easily be written:

$$H(z) = 0.5\left(\frac{B-z^{-2}}{1-B\cdot z^{-2}}\right) + j\cdot 0.5\cdot z^{-1} \quad (9)$$

$$= \frac{1}{2}\left(\frac{B-z^{-2}}{1-B\cdot z^{-2}} + j\cdot z^{-1}\right) = F_2(z)$$

Figure 7:
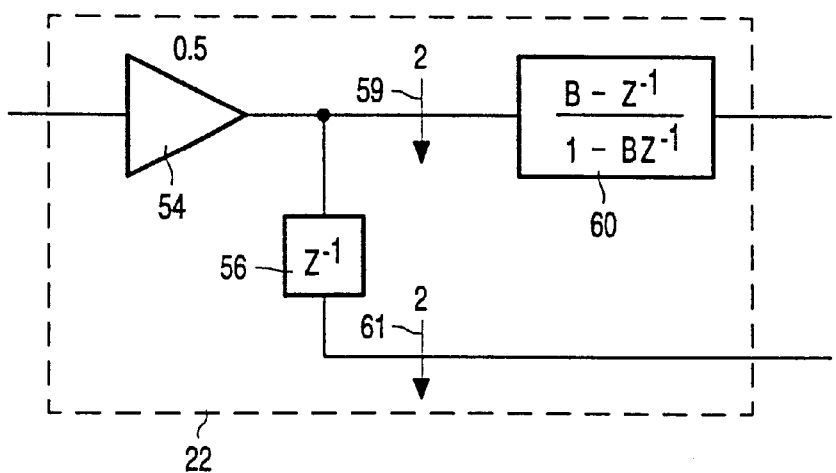
FIG. 7 shows a second embodiment of the filter section 22 in the digital filter according to FIG. 5.

The decimator 59 in the transform means 22 according to FIG. 6, can be shifted towards the scaling means 54 as is shown in FIG. 7. The delay elements in the filter element 60 should now be arranged for delaying their input signal over one sample period which has the same duration as the delay value of two sample periods of the higher sample frequency as was used in the filter element 58 in FIG. 6. The advantage of doing so is the reduced amount of computations required in the filter element element 60 because the number of samples to be calculated per unit of time has been halved. Also the number of required delay elements has been decreased.

Figure 8:
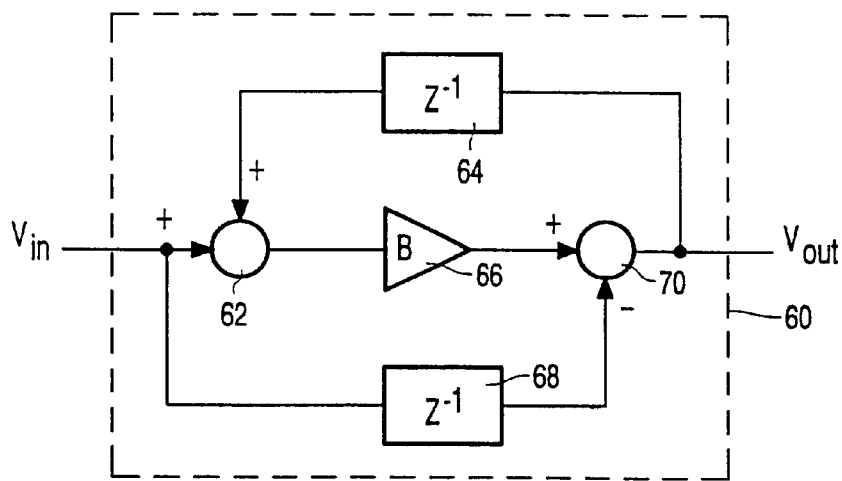
FIG. 8 shows a first embodiment of the filter element 60 in FIG. 7.

FIG. 8 shows a first embodiment of the filter element 60. The input of the filter element element 60 is connected to a first input of an adder 62 and to an input of a delay element 68. An output of the adder 62 is connected to an input of a scaling element 66. An output of the scaling element 66 is connected to a positive input of a subtractor 70 and an output of the delay element 68 is connected to a negative input of the subtractor 70. An output of the subtractor 70 is connected to the output of the filter element element 60 and to the input of a delay element 64. An output of the delay element 64 is connected to a second input of the adder 62.

The embodiment according to FIG. 8 is suitable if the number of calculations to be performed has to be minimized. This is advantageous when power consumption has to be minimized. In the embodiment according to FIG. 8 only one multiplier is necessary to scale the output of the adder 62 by a factor of B. The embodiment according to FIG. 8 needs two delay elements.

For the output signal $V_{out}$ of the filter element element 60 can be written:

$$V_{out} = (V_{in} + z^{-1}\cdot V_{out})\cdot B - z^{-1}\cdot V_{in} \quad (10)$$

Rearranging (10) results into:

$$H_{60}(z) = \frac{V_{out}}{V_{in}} = \left(\frac{B-z^{-1}}{1-B\cdot z^{-1}}\right) \quad (11)$$

Figure 9:
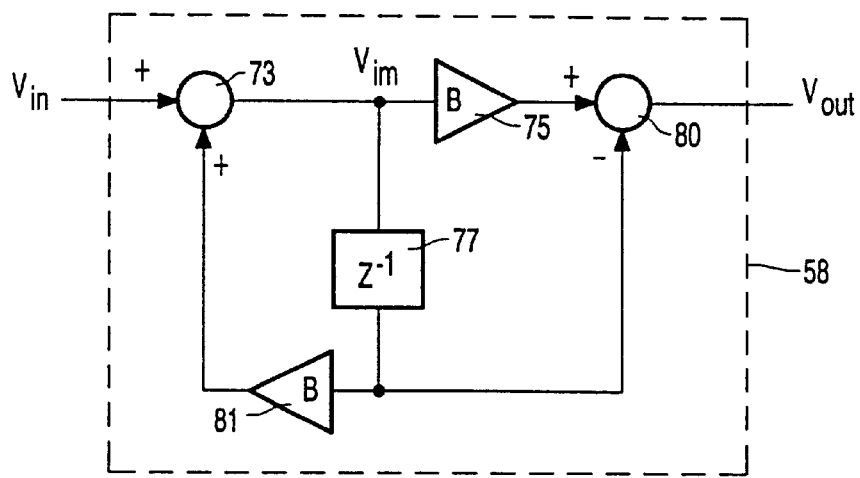
FIG. 9 shows a second embodiment of the filter element 60 in FIG. 7.

FIG. 9 shows a second embodiment of the filter element 60. The input of the filter element element 60 is connected to a first input of an adder 73 The output of the adder 73 is connected to an input of a scaling element 75 and to an input of a delay element 77. The output of the scaling element 75 is connected to a positive input of a subtractor 80. The output of the delay element 77 is connected to an input of a scaling element 81 and to a negative input of the subtrator 80. The output of the scaling element 81 is connected to a second input of the adder 73 The output of the subtrator 80 is connected to the output of the filter element 60.

The embodiment according to FIG. 9 can be used when the number of delay elements has to be minimized. This embodiment results in a minimized chip area at the expense of additional power consumption. In the embodiment according to FIG. 9 only one delay element but two scaling elements are required.

For the relation between Vin and VOut can be found:

$$\left.\begin{array}{l}V_{out} = V_{im}\cdot(B-z^{-1})\\V_{im} = V_{in} + z^{-1}\cdot B\cdot V_{im}\end{array}\right\} \quad (12)$$

Combining the equations in (12) gives for the transfer function $H_{60}(z)$ of the filter element 60:

$$H_{60}(z) = \frac{V_{out}}{V_{in}} = \frac{V_{out}}{V_{im}}\cdot\frac{V_{im}}{V_{in}} = \frac{B-z^{-1}}{1-B\cdot z^{-1}} \quad (13)$$

Figure 10:
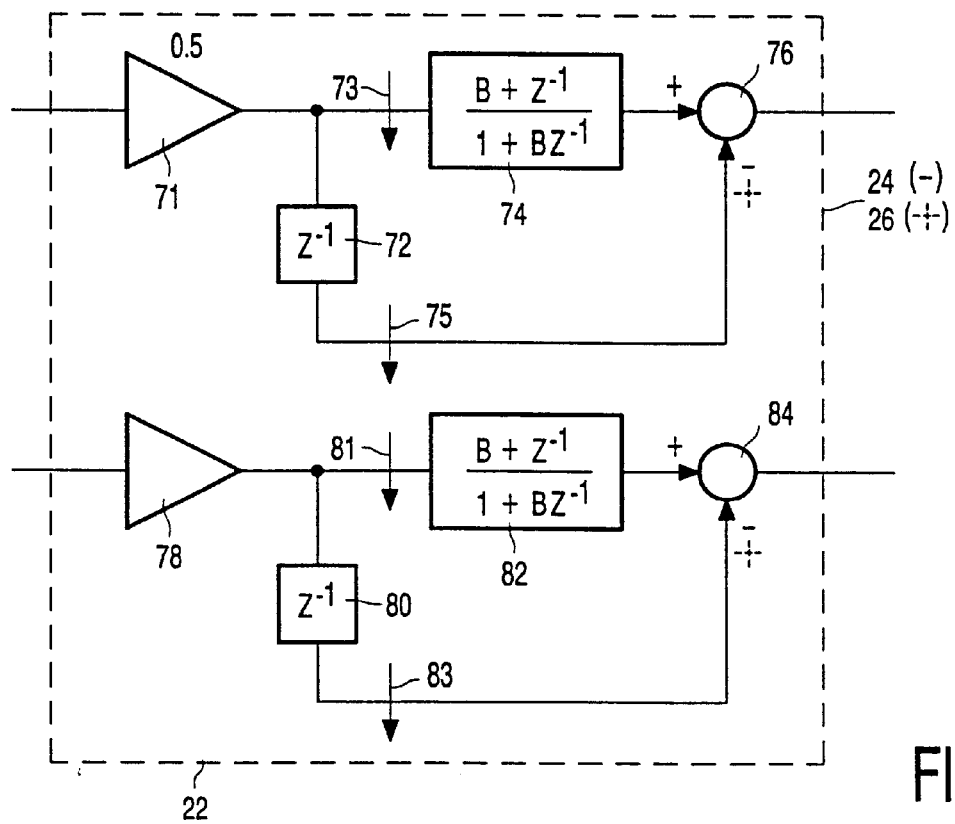
FIG. 10 shows an embodiment of the filter sections 24, 26 and 32 in the filter according to FIG. 4.

The filter section and 24, 26 and 32 according to FIG. 10 comprise identical elements in the path for the real part of the input signal and the path for the imaginary part of the input signal. The real part of the input signal is applied to an input of a scaling element 71 which scales the input signal by 0.5. The output of the scaling element 71 is connected via a decimator 73 to an input of a filter element 74 and to an input of a delay element 72. The output of the filter element 74 is connected to a first input of a subtractor/adder 76 and the output of the delay element 72 is connected via a decimator 75 to a second input of the subtractor/adder 76. The subtractor/adder 76 is arranged as a subtractor for the filter section 24 and 32 with transfer function $F_3(z)$, and is arranged as an adder for the filter section 26 with transfer function $F_1(z)$.

The imaginary part of the input signal is applied to an input of a scaling element 78 which scales the input signal by 0.5. The output of the scaling element 78 is connected via a decimator 81 to an input of a filter element 82 and to an input of a delay element 80. The output of the filter element 82 is connected to a first input of a subtractor/adder 84 and the output of the delay element 80 is connected via a decimator 83 to a second input of the subtractor/adder 84. The subtractor/adder 84 is arranged as a subtractor for the filter section 24 and 32, and is arranged as an adder for the filter section 26.

It can be derived by inspection that the transfer function of the filter sections 24, 26 and 32 according to FIG. 10 correspond to the transfer functions $F_3(z)$ and $F_1(z)$ respectively.

Figure 11:
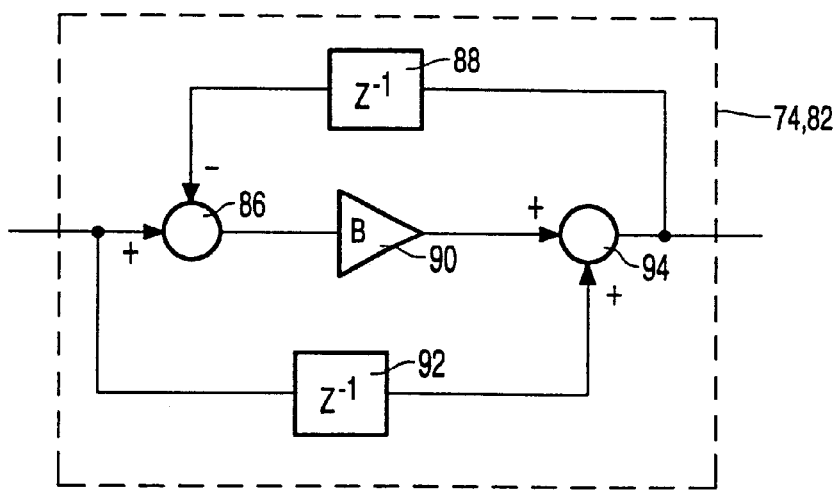
FIG. 11 shows an embodiment of the filter elements 74 and 82 in the filter sections according to FIG. 10.

FIG. 11 shows an embodiment of the filter elements 74 and 82. The input of the filter element 74, 82 is connected to a positive input of a subtrator 86 and to an input of a delay element 92. The output of the subtrator 86 is connected to a scaling element 90. The output of the scaling element 90 is connected to a first input of an adder 94. An output of the delay element 92 is connected to a second input of the adder 94. An output of the adder 94 is connected to the output of the filter element 74, 82 and to an input of a delay element 88. The output of the delay element 88 is connected to a negative input of the subtrator 86.

For the relation between the input signal $V_{in}$ and the output signal $V_{out}$ of the filter element 74, 82 can be found:

$$V_{out} = (V_{in} - Z^{-1} \cdot V_{out}) \cdot B + z^{-1} \cdot V_{in} \tag{14}$$

Rearranging (14) results into:

$$H_{74}(z) = \frac{B + z^{-1}}{1 + B \cdot z^{-1}} \tag{15}$$

Figure 12:
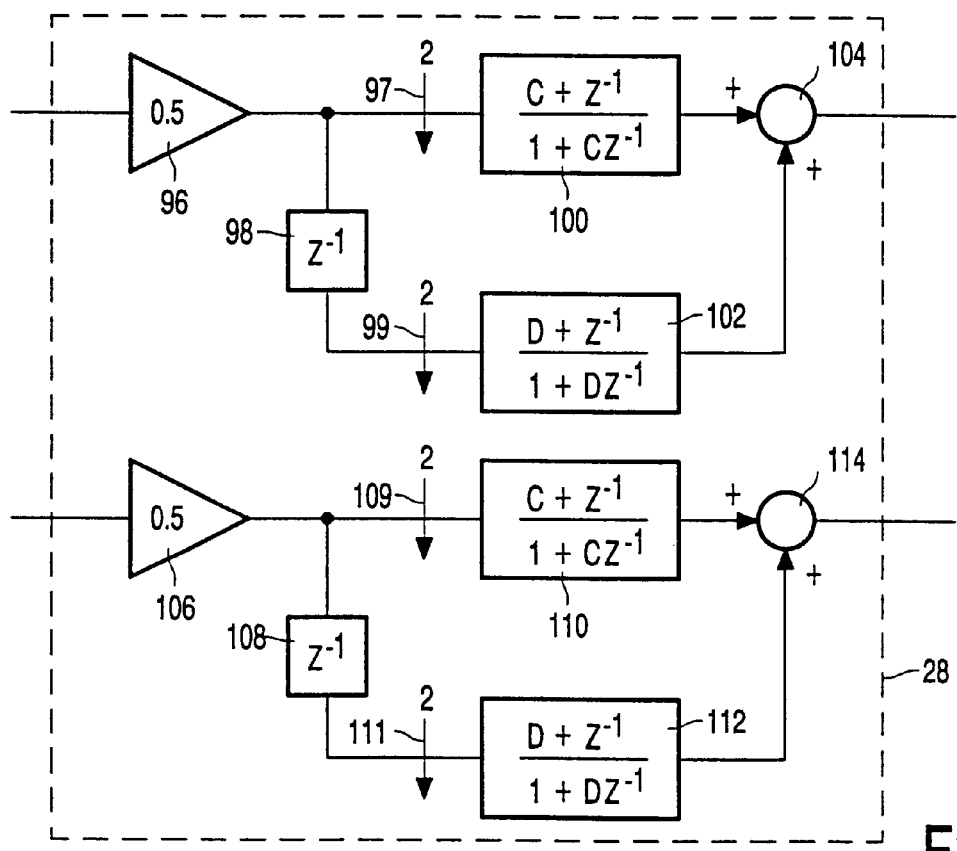
FIG. 12 shows an embodiment of the filter sections 28 and 34 in the digital filter according to FIG. 4.

In the filter section 28 according to FIG. 12 a first input carrying the real part of the input signal of the filter section 28 is connected to an input of a scaling element 96. The scaling element 96 scales its input signal by a factor of 0.5 in order to obtain a filter section having a pass band gain of 1. The output of the scaling element 96 is connected via a decimator 97 to a filter element 100. The output of the scaling element is further connected to an input of a delay element 98. The output of the delay element 98 is connected via a decimator 99 to a filter element 102. The output of the filter element 100 is connected to a first input of an adder 104 and the output of the filter element 102 is connected to a second input of the adder 104. The output of the adder 104 is connected to the output of the filter section 28 carrying the real part of the output signal of the filter section 28.

A second input carrying the imaginary part of the input signal of the filter section 28 is connected to an input of a scaling element 106. The scaling element 106 scales its input signal by a factor of 0.5. The output of the scaling element 106 is connected via a decimator 109 to a filter element 110. The output of the scaling element is further connected to an input of a delay element 108. The output of the delay element 108 is connected via a decimator 111 to a filter element 112. The output of the filter element 110 is connected to a first input of an adder 114 and the output of the filter element 112 is connected to a second input of the adder 114. The output of the adder 114 is connected to the output of the filter section 28 carrying the imaginary part of the output signal of the filter section 28.

It can easily be seen that the transfer functions of both paths of the filter element 28 is equal to $G_1(z)$ according to (8) It is observed that the replacement of $z^{31\ 2}$ in (8) by $z^{-1}$ in the filter elements is caused by moving the decimators 97, 99 109 and 111 as already is explained with reference to FIG. 6 and FIG. 7.

Figure 13:
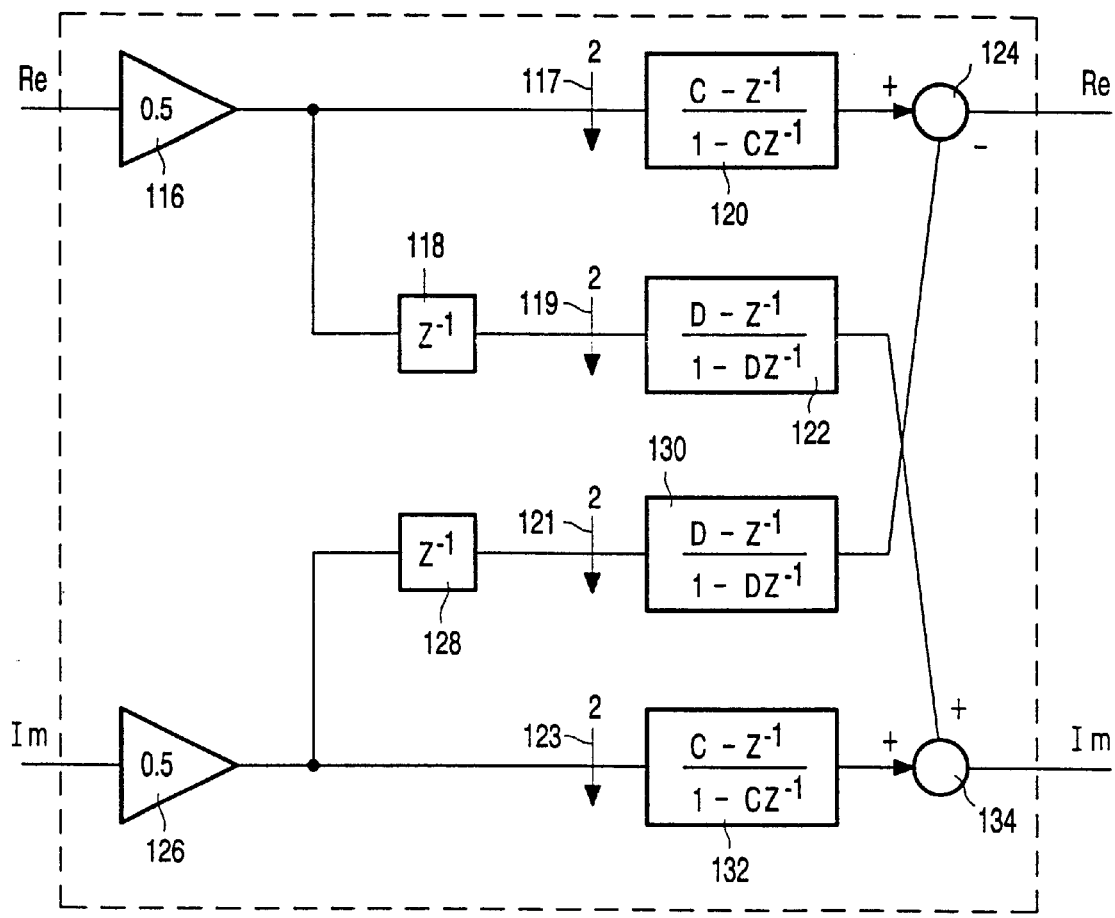
FIG. 13 shows an embodiment of the filter section 30 in the digital filter according to FIG. 4.

FIG. 13 shows an implementation of a fifth order filter section which could realize the function of filter section 30 when the constants C and D are set to appropriate values. A first input, carrying the real part of the input signal of the filter section, is connected to a scaling element 116 which scales the input signal by a factor of 0.5. The output of the scaling element 116 is connected to a decimator 117 and to an input of a delay element 118. A second input, carrying the imaginary part of the input signal of the filter section, is connected to a scaling element 126 which scales the input signal by a factor of 0.5. The output of the scaling element 126 is connected to a decimator 123 and to an input of a delay element 128. The output of the delay element 118 is connected to an input of a decimator 119 and the output of the delay element 128 is connected to an input of a decimator 121.

The output of the decimator 117 is connected to the input of a filter element 120, the output of the decimator 119 is connected to the input of a filter element 122, the output of the decimator 121 is connected to the input of a filter element 130 and the output of the decimator 123 is connected to the input of a filter element 132.

The output of the filter element 120 is connected to a positive input of a subtrator 124, the output of the filter element 130 is connected to a negative input of the subtrator 124, the output of the filter element 122 is connected to a first input of an adder 134 and the output of the filter element 132 is connected to a second input of the adder 134. The output of the subtrator 124 is connected to the output of the filter section carrying the real part of the output signal of the filter section. The output of the subtracter 134 is connected to the output of the filter section carrying the imaginary part of the output signal of the filter section.

For the complex output signal of the filter section 30 $\Re e(V_{out}) + j\Im m(V_{out})$ can be derived:

$$V_{out} = \{\Re e(V_{in}) + j\, Im(V_{in})\} \frac{C - z^{-2}}{2(1 - C \cdot z^{-2})} + \tag{16}$$

$$\{j\Re e(V_{in}) - Im(V_{in})\} \cdot z^{-1} \frac{D - z^{-2}}{2(1 - D \cdot z^{-2})}$$

This can be written as:

$$V_{out} = V_{in}\left(\frac{C - z^{-2}}{2(1 - C \cdot z^{-2})} + jz^{-1}\frac{D - z^{-2}}{2(1 - D \cdot z^{-2})}\right) \tag{17}$$

With D=1 and C=B the transfer function of the filter section 30 according (17) changes into $F_2(z)$ according to (9).

Figure 14:
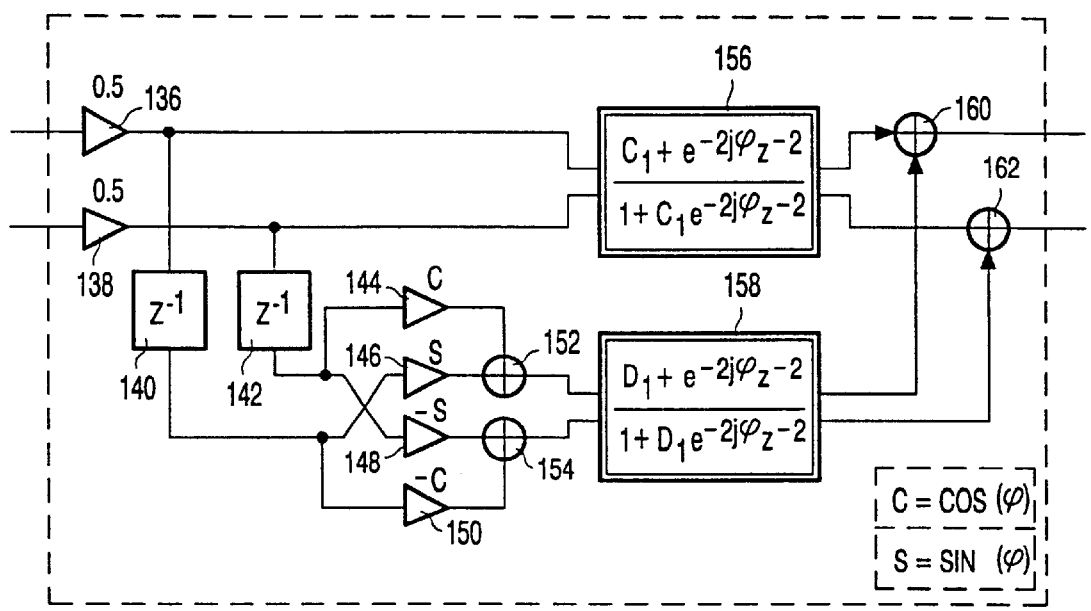
FIG. 14 shows an embodiment of a filter section with a transfer function being obtained by shifting the transfer function of a prototype (low pass) filter section with real coefficients over an arbitrary value over the frequency axis.

FIG. 14 shows a filter section which realizes a transfer function $G_5(z)$ derived from the prototype transfer function $G_1(z)$ by an arbitrary shift over the frequency axis.

Substituting (4) into (8) results into:

$$G_5(z) = \frac{1}{2}\left( \frac{C + e^{-2j\varphi} \cdot z^{-2}}{1 + C \cdot e^{-2j\varphi} \cdot z^{-2}} + e^{-j\varphi} \cdot z^{-1} \frac{D + e^{-2j\varphi} \cdot z^{-2}}{1 + D \cdot e^{-2j\varphi} \cdot z^{-2}} \right) \quad (18)$$

By expanding the term $e^{-j\phi}$ into $\cos \phi - j \cdot \sin \phi$, (18) changes into:

$$G_5(z) = \frac{1}{2}\left( \frac{C + e^{-2j\varphi} \cdot z^{-2}}{1 + C \cdot e^{-2j\varphi} \cdot z^{-2}} + (\cos\varphi - j \cdot \sin\varphi) \cdot z^{-1} \frac{D + e^{-2j\varphi} \cdot z^{-2}}{1 + D \cdot e^{-2j\varphi} \cdot z^{-2}} \right) \quad (19)$$

Due to the complex input and output signals of the filter according to FIG. 14, the filter comprises a scaling element 136 for the real part of the input signal and a scaling element 138 for the imaginary part of the input signal. The first part of the transfer function is realized by the filter element 156 having complex input and output signals. The operation z in (19) is implemented by the delay elements 140 and 142. The multiplication of $z^{-1}$ with $\cos \phi - j \cdot \sin \phi$ is performed by the scaling elements 144, 146, 148 and 150 and the adders 152 and 154. For $\phi$ is a multiple of $\pi/4$ the implementation of the scaling elements 144, 146, 148 and 150 is very easy. The second part of the transfer function is realized by the filter element 158. The adders 160 and 162 are arranged to combine the partial transfer functions into the complete transfer function.

Figure 15:
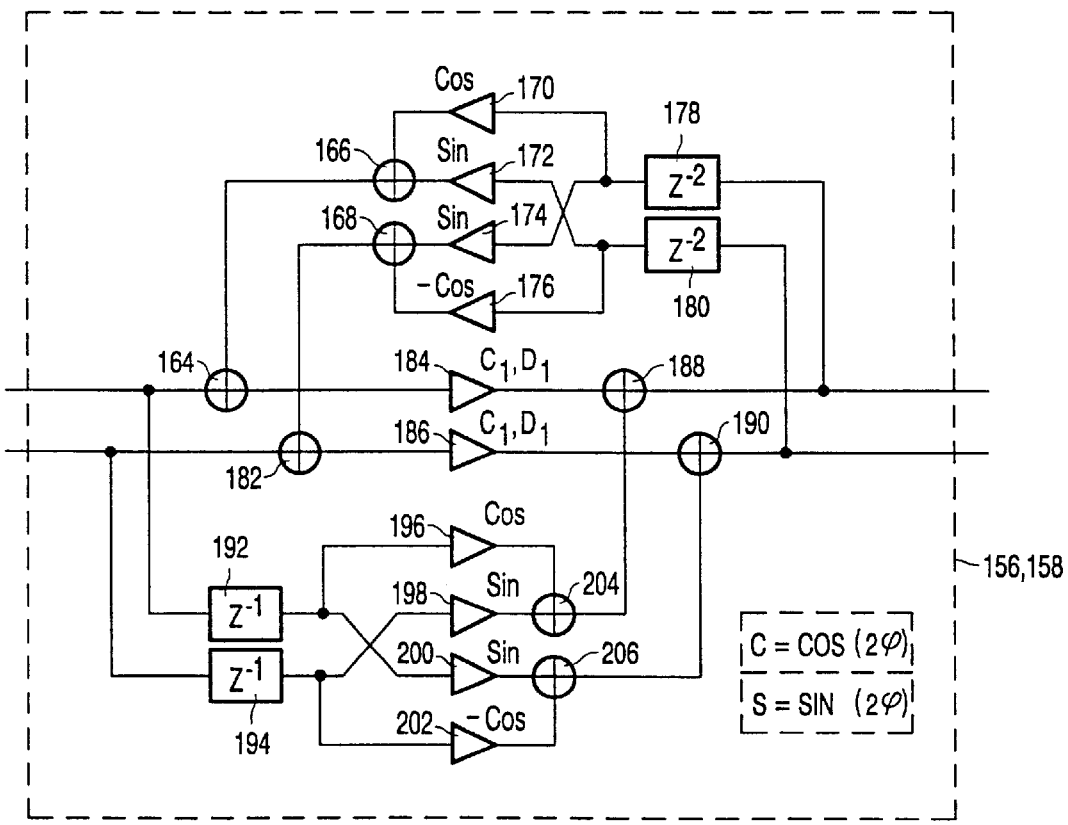
FIG. 15 shows an implementation of the filter elements 156 and 158 in the filter according to FIG. 14.

FIG. 15 shows the implementation of the filter elements 156 and 158. To arrive at this implementation the term $e^{-2j}$ $\phi$ is expanded as $\cos 2\phi - j \cdot \sin 2\phi$ and substituted in the corresponding part of the transfer function. The transfer function of the filter element 146 changes accordingly into:

$$H_{156}(z) = \frac{C_1 + (\cos 2\varphi - j \cdot \sin 2\varphi) \cdot z^{-2}}{1 + C_1 + (\cos 2\varphi - j \cdot \sin 2\varphi) \cdot z^{-2}} \quad (20)$$

The scaling elements 184 and 186 determine the value of $C_1$ in (20). The combination of the scaling elements 170, 172, 174 and 176, and the adders 166 and 168, and the combination of the scaling elements 196, 198, 200 and 202, and the adders 204 and 206, are arranged for obtaining the multiplication of $z^{-2}$ with $(\cos 2\phi - j \cdot \sin 2\phi)$. For $\phi$ is a multiple of $\pi/8$ the implementation of the scaling elements 144, 146, 148 and 150 is very easy.

The introduction of this arbitrary phase shift introduces additional design freedom at the expense of an increased complexity.

What is claimed is:

1. Time discrete filter comprising a cascade connection of a plurality of decimating filter sections, at least one of said filter sections comprising transformation means for transforming a real signal into a complex signal, characterized in that the transformation means have a transfer function with a transition band between a frequency in the pass band of the transformation means and a frequency to which a signal falling within said pass band is transferred at an output of said at least one of said filter sections.

2. Filter according to claim 1, characterized in that said at least one of said filter sections has a total transfer function resulting from a transformation of an original transfer function that is symmetrical around zero.

3. Filter according to claim 2, characterized in that the transformation is defined by shifting the original transfer function according to a frequency shift.

4. Filter according to claim 3, characterized in that the frequency shift is a multiple of one eighth of the sample frequency of the input signal of the at least one of said filter sections.

5. Filter according to claim 4, characterized in that the frequency shift is a multiple of one fourth of the sample frequency of the at least one of said filter sections.

6. Filter according to claim 1, characterized in that the filter sections are arranged for decimating the input signal with a factor N, and in that the filter sections comprise filter elements that comprise delay elements with a delay value equal to N times the sampling period of the signal at the output of the preceding stage.

7. Filter according to claim 6, characterized in that the factor N is equal to two and in that the filter elements are of the bireciprocal type.

8. Filter according to claim 7, characterized in that the filter elements comprise at least one third order bireciprocal filter.

9. Filter according to claim 8, characterized in that the filter elements comprise at least one fifth order bireciprocal filter.

10. Tone detector using a filter according to claim 1.

11. Time discrete filter comprising a cascade connection of a plurality of decimating filter sections, at least one of the filter sections comprising transformation means for transforming a real signal into a complex signal, the transformation means having a transfer function with
  a pass band; and
  a stop band; and
  a transition band between the stop band and the pass band; and
at least one other element, comprising at least a frequency shift functionality, which functionality shifts signals in the pass band of the transformation means into signals in the stop band of the transformation means.

12. The filter of claim 11, wherein the at least one other element is cascaded after the transformation means in the at least one of the filter sections.

* * * * *